(12) United States Patent
Hilkene et al.

(10) Patent No.: US 8,586,952 B2
(45) Date of Patent: Nov. 19, 2013

(54) TEMPERATURE CONTROL OF A SUBSTRATE DURING A PLASMA ION IMPLANTATION PROCESS FOR PATTERNED DISC MEDIA APPLICATIONS

(75) Inventors: Martin A. Hilkene, Gilroy, CA (US); Matthew D. Scotney-Castle, Morgan Hill, CA (US); Peter I. Porshnev, Santa Clara, CA (US); Roman Gouk, San Jose, CA (US); Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 125 days.

(21) Appl. No.: 12/916,600

(22) Filed: Oct. 31, 2010

(65) Prior Publication Data

US 2011/0101247 A1 May 5, 2011

Related U.S. Application Data

(60) Provisional application No. 61/257,644, filed on Nov. 3, 2009.

(51) Int. Cl.
*G21G 5/00* (2006.01)
(52) U.S. Cl.
USPC .......... 250/492.3; 250/492.1; 250/492.2; 427/457; 427/523
(58) Field of Classification Search
USPC ............. 250/492.1, 492.2, 492.3, 492.21; 427/457, 523
See application file for complete search history.

(56) References Cited

U.S. PATENT DOCUMENTS

| | | | |
|---|---|---|---|
| 4,542,009 A * | 9/1985 | Palmer .................... | 148/239 |
| 2005/0127192 A1 | 6/2005 | Kang et al. | |
| 2007/0042603 A1 | 2/2007 | Kropewnicki et al. | |
| 2007/0114440 A1 * | 5/2007 | Yang .................... | 250/440.11 |
| 2007/0281172 A1 * | 12/2007 | Couillard et al. ........... | 428/446 |
| 2008/0042078 A1 * | 2/2008 | England et al. .......... | 250/492.21 |
| 2008/0179547 A1 * | 7/2008 | Henley .................... | 250/492.21 |
| 2009/0159566 A1 | 6/2009 | Brillhart et al. | |

OTHER PUBLICATIONS

PCT international search report and written opinion of PCT/US2010/053397 dated Apr. 26, 2011.

* cited by examiner

*Primary Examiner* — Robert Kim
*Assistant Examiner* — Hanway Chang
(74) *Attorney, Agent, or Firm* — Patterson & Sheridan, LLP

(57) ABSTRACT

Embodiments of the invention provide a method of reducing thermal energy accumulation during a plasma ion implantation process for forming patterns including magnetic and non-magnetic domains on a magnetically susceptible surface on a substrate. In one embodiment, a method of controlling a substrate temperature during a plasma ion implantation process includes (a) performing a first portion of a plasma ion implantation process on a substrate having a magnetically susceptible layer formed thereon in a processing chamber for a first time period, wherein a temperature of the substrate is maintained below about 150 degrees Celsius, (b) cooling the temperature of the substrate after the first portion of the plasma ion implantation process has been completed, and (c) performing a second portion of the plasma ion implantation process on the substrate, wherein the temperature of the substrate is maintained below 150 degrees Celsius.

17 Claims, 5 Drawing Sheets

TEMPERATURE CONTROL OF A SUBSTRATE DURING A PLASMA ION IMPLANTATION PROCESS FOR PATTERNED DISC MEDIA APPLICATIONS

CROSS-REFERENCE TO RELATED APPLICATIONS

This application claims benefit of U.S. Provisional Application Ser. No. 61/257,644 filed Nov. 3, 2009, which is incorporated by reference in their entirety.

FIELD

Embodiments of the invention relate to hard-disk drive (HDD) media, and apparatus and methods for making hard-disk drive media. More specifically, embodiments of the invention relate to methods and apparatus for forming a patterned magnetic disc medium for a hard-disk drive.

BACKGROUND

Hard-disk drives (HDD) are the storage medium of choice for computers and related devices. They are found in most desktop and laptop computers, and may also be found in a number of consumer electronic devices, such as media recorders and players, and instruments for collecting and recording data. Hard-disk drives are also deployed in arrays for network storage.

Hard-disk drives store information magnetically. The disk in a hard-disk drive is configured with magnetic domains that are separately addressable by a magnetic head. The magnetic head moves into proximity with a magnetic domain and alters the magnetic properties of the domain to record information. To recover the recorded information, the magnetic head moves into proximity with the domain and detects the magnetic properties of the domain. The magnetic properties of the domain are generally interpreted as corresponding to one of two possible states, the "0" state and the "1" state. In this way, digital information may be recorded on the magnetic medium and recovered thereafter.

The magnetic medium in a hard-disk drive is generally a glass, composite glass/ceramic, or metal substrate, which is generally non-magnetic, with a magnetically susceptible material deposited thereon. The magnetically susceptible material is generally deposited to form a pattern, such that the surface of the disk has areas of magnetic susceptibility interspersed with areas of magnetic inactivity. The non-magnetic substrate is usually topographically patterned, and the magnetically susceptible material deposited by spin-coating or electroplating. The disk may then be polished or planarized to expose the non-magnetic boundaries around the magnetic domains. In some cases, the magnetic material is deposited in a patterned way to form magnetic grains or dots separated by a non-magnetic area.

Such methods are expected to yield storage structures capable of supporting data density up to about 1 TB/in$^2$, with individual domains having dimensions as small as 20 nm. Where domains with different spin orientations meet, there is a region referred to as a Bloch wall in which the spin orientation goes through a transition from the first orientation to the second. The width of this transition region limits the areal density of information storage because the Bloch wall occupies an increasing portion of the total magnetic domain.

To overcome the density limits due to Bloch wall widths in continuous magnetic thin films, the domains can be physically separated by a non-magnetic region (which can be narrower than the width of a Bloch wall in a continuous magnetic thin film). Conventional approaches to create discrete magnetic and non-magnetic areas on a medium have focused on forming single bit magnetic domains that are completely separate from each other, either by depositing the magnetic domains as separate islands or by removing material from a continuous magnetic film to physically separate the magnetic domains. A substrate may be masked and patterned by a mask material, and a magnetic material deposited over exposed portions, or the magnetic material may be deposited before masking and patterning, and then etched away in exposed portions. In either case, the topography of the substrate is altered by the residual pattern of the magnetic regions. Because the read-write head of a typical hard-disk drive may fly as close as 2 nm from the surface of the disk, these topographic alterations can become limiting. Furthermore, during the depositing, etching and patterning processes of manufacturing the hard-disk drives, the substrate may experience multiple heating and thermal processes. The thermal energy provided to the substrate during these processes may adversely harden the mask material or disrupt alignment of atomic spins arranged in the magnetic regions. Hardening the mask layer may result in residuals mask material remaining on the substrate after the mask layer stripping process, thereby contaminating the structure formed on the substrate. Additionally, excessive heating may cause re-crystallization of materials, which may adversely change or modify the magnetic properties intended to be formed in the device, thereby causing degradation of the magnetic performance of the hard-disk drives.

Thus, there is a need for a method of patterning magnetic media to form magnetic and non-magnetic areas on a medium that has high resolution and does not alter the topography and magnetic performance of the hard-disk drives.

SUMMARY

Embodiments of the invention provide a method of reducing thermal energy accumulation during a plasma ion implantation process for forming patterns including magnetic and non-magnetic domains on a magnetically susceptible surface on a substrate. In one embodiment, a method of controlling a substrate temperature during a plasma ion implantation process includes (a) performing a first portion of a plasma ion implantation process on a substrate having a magnetically susceptible layer formed thereon in a processing chamber for a first time period, wherein a temperature of the substrate is maintained below about 150 degrees Celsius, (b) cooling the temperature of the substrate after the first portion of the plasma ion implantation process has been completed, and (c) performing a second portion of the plasma ion implantation process on the substrate, wherein the temperature of the substrate is maintained below 150 degrees Celsius.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings.

To facilitate understanding, identical reference numerals have been used, where possible, to designate identical elements that are common to the figures. It is contemplated that elements disclosed in one embodiment may be beneficially utilized on other embodiments without specific recitation.

It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide apparatus and methods of controlling a substrate temperature during a plasma ion implantation process for forming magnetic and non-magnetic regions on a magnetic media substrate for hard disk drives. The apparatus and methods include controlling a substrate temperature below a predefined temperature while performing a plasma ion implantation process on the substrate surface to prevent the substrate from overheating during the implantation process. Accordingly, by maintaining the substrate temperature below at a desired temperature during processing, magnetic and non-magnetic domains may be formed without adversely disrupting or destroying the magnetic performance either of the magnetic and non-magnetic domains during processing.

Figure 1:
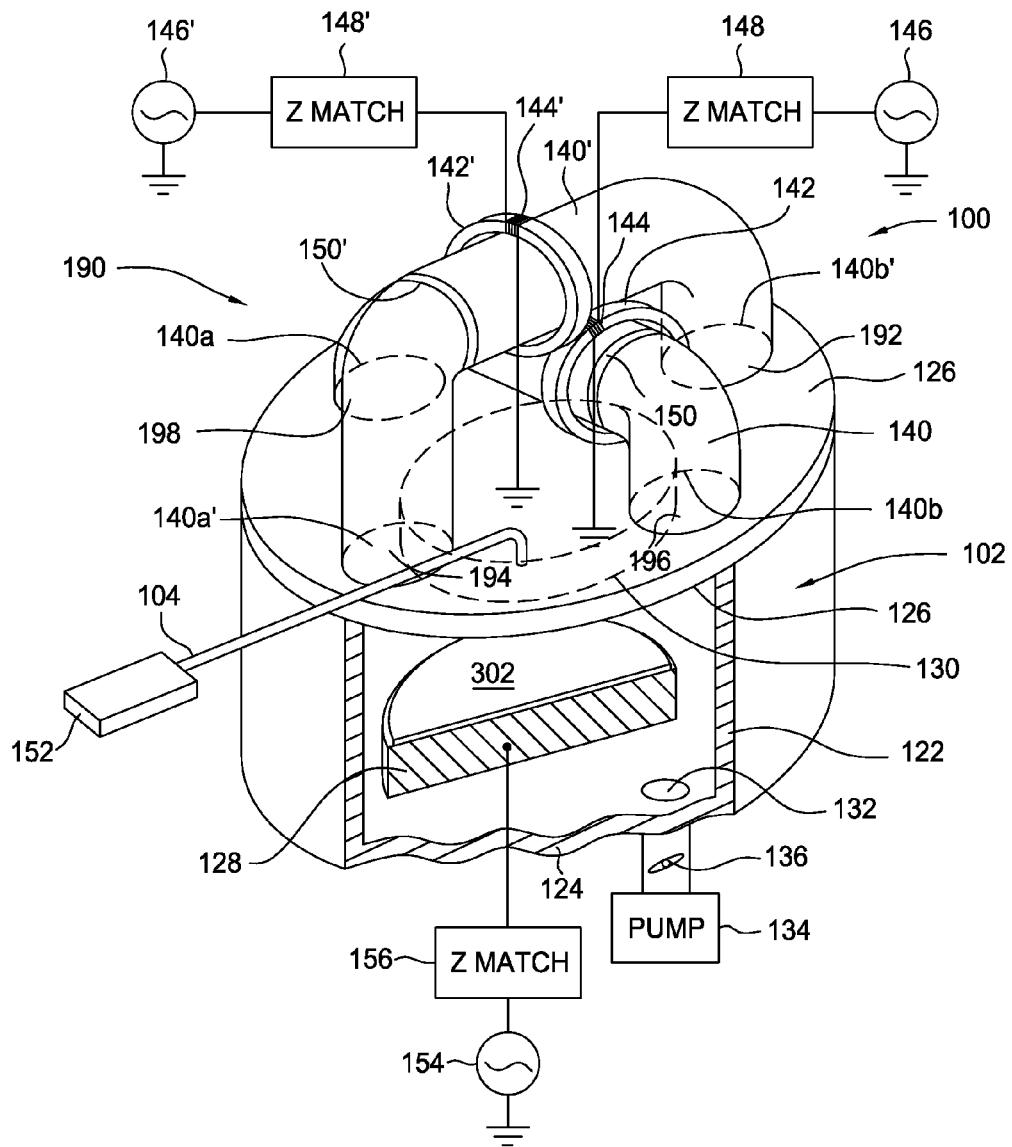
FIG. 1 depicts one embodiment of a plasma immersion ion implantation tool suitable for practice one embodiment of the present invention.

FIG. 1 is an isometric drawing of a plasma ion implantation chamber that may be utilized to practice embodiments of the present invention. The chamber of FIG. 1 is useful for performing ion implantation, but may also be used to shower a substrate with energetic ions without implanting. It is contemplated that other equipment may be adapted to perform the invention. The exemplary processing chamber 100 includes a chamber body 102 having a bottom 124, a top 126, and side walls 122 enclosing a process region 104. A substrate support assembly 128 is supported from the bottom 124 of the chamber body 102 and is adapted to receive a substrate 302 for processing. In one embodiment, the substrate support assembly 128 may include an embedded heater element or cooling element 160 suitable for controlling the temperature of the substrate 302 supported on the substrate support assembly 128.

A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A process gas source 152 is coupled to the gas distribution plate 130 to supply gaseous precursor compounds for processes performed on the substrate 302.

The processing chamber 100 depicted in FIG. 1 further includes a plasma source 190. The plasma source 190 includes a pair of separate external reentrant conduits 140, 140' mounted on the outside of the top 126 of the chamber body 102 disposed transverse to one another or orthogonal to one another. The first external conduit 140 has a first end 140a coupled through an opening 198 formed in the top 126 into a first side of the process region 104 in the chamber body 102. A second end 140b has an opening 196 coupled into a second side of the process region 104. The second external reentrant conduit 140b has a first end 140a' having an opening 194 coupled into a third side of the process region 104 and a second end 140b' having an opening 192 into a fourth side of the process region 104. In one embodiment, the first and second external reentrant conduits 140, 140' are configured to be orthogonal to one another, thereby providing the two ends 140a, 140a', 140b, 140b' of each external reentrant conduits 140, 140' disposed at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may have other configurations utilized to control plasma distribution in the process region 104.

Magnetically permeable torroidal cores 142, 142' surround a portion of a corresponding one of the external reentrant conduits 140, 140'. The conductive coils 144, 144' are coupled to respective RF power sources 146, 146' through respective impedance match circuits or elements 148, 148'. Each external reentrant conduits 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF bias generator 154 coupled to the substrate support assembly 128 through an impedance match circuit or element 156.

Process gases including gaseous compounds supplied from the process gas source 152 are introduced through the overhead gas distribution plate 130 into the process region 104. RF power source 146 is coupled from the power applicators, i.e., core and coil, 142, 144 to gases supplied in the conduit 140, which creates a circulating plasma current in a first closed torroidal path power source 146' may be coupled from the other power applicators, i.e., core and coil, 142', 144' to gases in the second conduit 140', which creates a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF power sources 146, 146', which may be the same or slightly offset from one another.

In operation, a process gas is provided to the chamber from the process gas source 152. Depending on the embodiment, the process gas may comprise inert or reactive gases to be ionized and directed toward the substrate 302. Some inert gases that may be used include helium, argon, neon, krypton, and xenon, among others. Reactive or reactable gases that may be used include borane and its oligomers, such as diborane, phosphine and its oligomers, arsine, nitrogen containing gases, halogen containing gas, hydrogen containing gases, oxygen containing gases, carbon containing gases, and combinations thereof. In some embodiments, nitrogen gas, hydrogen gas, oxygen gas, and combinations thereof may be used. In other embodiments, ammonia and its derivatives, analogues, and homologues, may be used, or hydrocarbons such as methane or ethane may be used. In still other embodiments, halogen containing gases, such as fluorine or chlorine containing gases like $BF_3$, may be used. Any substance that may be readily vaporized, and that does not deposit a material substantially identical to the magnetically susceptible layer of the substrate, may be used to modify its magnetic properties through bombardment or implantation. Most hydrides may be used, such as silane, borane, phosphine, diborane ($B_2H_6$), methane, and other hydrides. Also, carbon dioxide and carbon monoxide may be used.

The power of each RF power source 146, 146' is operated so that their combined effect efficiently dissociates the process gases supplied from the process gas source 152 and produces a desired ion flux at the surface of the substrate 302. The power of the RF bias generator 154 is controlled at a selected level at which the ion energy dissociated from the process gases may be accelerated toward the substrate surface and implanted at a desired depth below the top surface of the substrate 302 in a desired ion concentration. For example, with relatively low RF power of about 100 W would give ion energy of about 200 eV. Dissociated ions with low ion energy may be implanted at a shallow depth between about 1 Å and about 500 Å from the substrate surface. Alternatively, high bias power of about 5000 W would give ion energy of about 6 keV. The dissociated ions with high ion energy provided and generated from high RF bias power, such as higher than about 100 eV, may be implanted into the substrate having a depth substantially over 500 Å depth from the substrate surface. In one embodiment, the bias RF power supplied to the chamber may be between about 100 Watts and about 7000 Watts, which equates to ion energy between about 100 eV and about 7 keV.

Whereas disrupting the alignment of atomic spins in selected portions of the magnetic layer is desired, ion implant with relatively high energy, such as between about 200 eV and about 5 keV, or between about 500 eV and about 4.8 keV, such as between about 2 keV and about 4 keV, for example about 3.5 keV, may be useful. The combination of the controlled RF plasma source power and RF plasma bias power dissociates electrons and ions in the gas mixture, imparts a desired momentum to the ions, and generates a desired ion distribution in the processing chamber 100. The ions are biased and driven toward the substrate surface, thereby implanting ions into the substrate in a desired ion concentration, distribution and depth from the substrate surface. In some embodiments, ions may be implanted at a concentration between about $10^{16}$ atoms/cm$^3$ and about $10^{23}$ atoms/cm$^3$ at a depth ranging from about 1 nm to about 100 nm, depending on the thickness of the magnetic layer.

Implanting ions deeply in the magnetic layer effects the most change to the magnetic properties of the implanted area. A shallow implant, such as 2-10 nm in a 100 nm thick layer will leave a significant portion of the layer beneath the implanted area with atomic spins in alignment. Such a shallow implant with ions having energy between about 200 eV and about 1,000 eV will cause a partial change to the magnetic properties. Thus, the degree of change imposed may be selected by tuning the depth of the implant. The size of ion implanted will also affect the energy needed to implant to a given depth. For example, helium ions implanted into a magnetic material at an average energy of about 2000 eV will demagnetize the magnetic material by about 20% to about 50%, and argon ions implanted at an average energy of about 2,000 eV will demagnetize by about 50% to about 80%.

Figure 2:
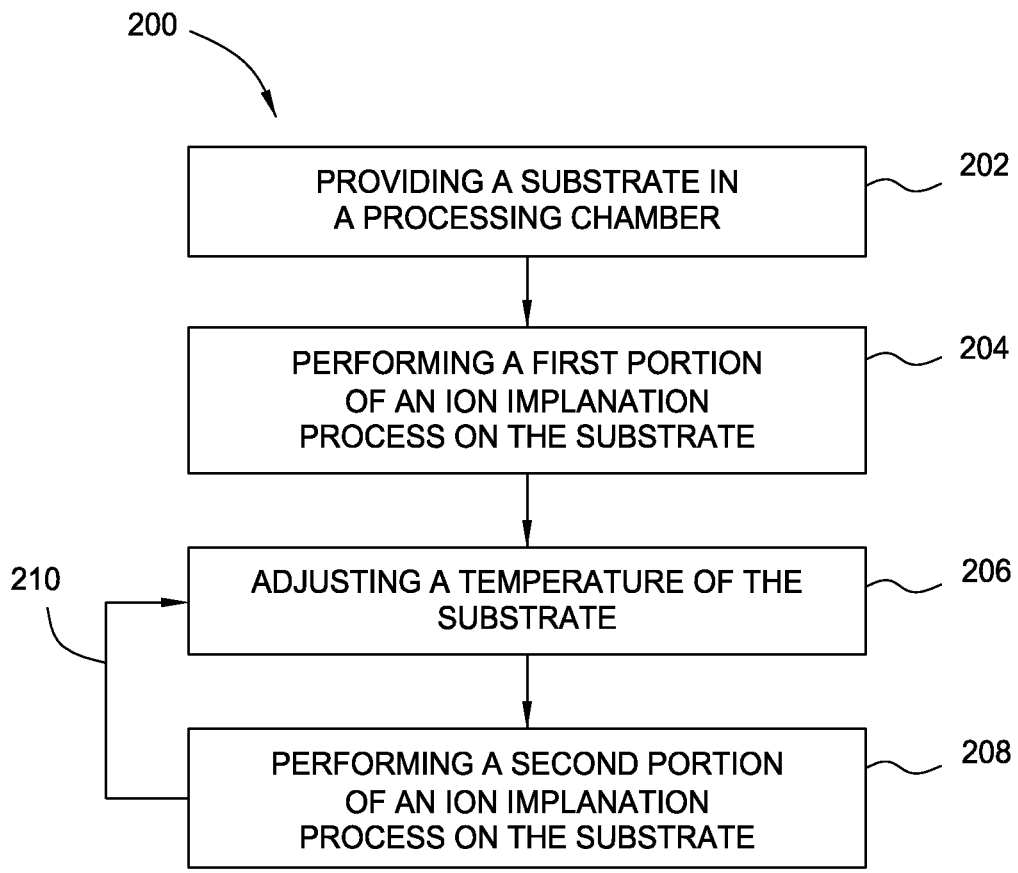
FIG. 2 depicts a flow diagram illustrating a method for plasma ion implantation process according to one embodiment of the present invention.

FIG. 2 depicts a flow diagram illustrating a method 200 for controlling a temperature of a substrate while performing a plasma ion implantation process according to one embodiment of the present invention. The method 200 is configured to perform in a plasma ion implantation processing chamber, such as the processing chamber 100 as described in FIG. 1. It is contemplated that the method 200 may be performed in other suitable processing systems, including those from other manufacturers.

Figure 3:
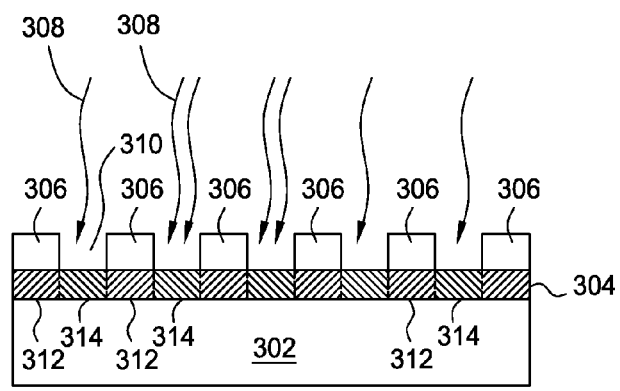
FIG. 3 depicts a schematic side view of a substrate having a magnetically susceptible layer disposed thereon for processing a plasma ion implantation process according to one embodiment of the invention.

The method 200 begins at step 202 by providing a substrate, such as the substrate 302 depicted in FIGS. 1 and 3, in the processing chamber 100. In one embodiment, the substrate 302 may be fabricated from metal or glass, silicon substrate, dielectric bulk material and metal alloys or composite glass substances such as glass/ceramic blends. In one embodiment, the substrate 302 has magnetically susceptible layer 304 disposed thereon, as shown in FIG. 3. The magnetically susceptible layer 304 is generally formed from one or more ferromagnetic materials. In some embodiments, the magnetically susceptible layer 304 comprises a plurality of layers having the same or different compositions. In one embodiment, the magnetically susceptible layer 304 comprises a first layer and a second layer disposed on the first layer, wherein the first layer is a soft magnetic material, which is generally defined as a material with low magnetic coercivity, while the second layer has higher coercivity than the first layer. In some embodiments, the first layer may comprise iron, nickel, platinum, or combinations thereof. In some embodiments, the first layer may comprise a plurality of sub-layers having the same or different compositions. The second layer may also comprise a variety of materials, such as cobalt, chromium, platinum, tantalum, iron, terbium, gadolinium, or combinations thereof. The second layer may also comprise a plurality of sub-layers (not shown) having the same or different compositions. In one embodiment, the magnetically susceptible layer 304 comprises a first layer of iron or iron/nickel alloy having a thickness between about 100 nm and about 1,000 nm (1 μm) and a second layer of chromium, cobalt, platinum or combinations thereof having a thickness between about 30 nm and about 70 nm, such as about 50 nm. These layers may be formed by any suitable method, such as physical vapor deposition, or sputtering, chemical vapor deposition, plasma-enhanced chemical vapor deposition, spin-coating, plating by electrochemical or electroless means, and the like.

A mask material 306 is applied to an upper surface of the magnetically susceptible layer 304. The mask material 306 is patterned to form openings 310 to expose unmasked first portions 314 of the underlying magnetically susceptible layer 304 for processing, and to leave masked second portions 312 of the underlying magnetically susceptible layer 304 covered by the remaining portion of the mask material 306. The patterned mask material 306 prevents the second portions 312 of the underlying magnetically susceptible layer 304 from being processed. The patterned mask layer 306 allows domains of varying magnetic activity to be formed in the masked and unmasked portions 312, 314 of the magnetically susceptible layer 304. The mask layer 306 generally comprises a material that can be readily removed without altering the magnetically susceptible layer 304, or a material that will not adversely affect the device properties if not removed. For example, in many embodiments, the mask layer 306 is soluble in a solvent liquid, such as water or hydrocarbon. In some embodiments, the mask layer 306 is applied to the substrate as a curable liquid, patterned by physical imprint with a template, and cured by heating or UV exposure. The mask layer 306 is also resistant to degradation by incident energy or energetic ions. In some embodiments, the mask layer 306 is a curable material, such as an epoxy or thermoplastic polymer, that will flow prior to being cured and will provide some resistance to energetic processes after curing.

The mask layer 306 may leave the first portions 314 defined by the openings 310 completely exposed for processing and the second portions 312 covered with a thin or thick mask layer 306 as to protect the second portion 312 from being processed. The unmasked first portions 314 of the magnetically susceptible layer 304 are exposed to energy during processing which alters the magnetic properties of the unmasked portions 314. Upon removal of the mask layer 306, the magnetically susceptible layer 304 is left with its original topography, but now includes a very fine pattern of magnetic and non-magnetic domains defined be the processed first portion 314 and unprocessed of second portions 314 capable of supporting storage densities in excess of 1 Tb/in$^2$.

At step 204, a first portion of a plasma ion implantation process is performed to implant ions into the first portions 314 of the substrate 302 unprotected by the mask layer 306, as shown by arrows 308 depicted in FIG. 3. The plasma ion implantation process performed at step 204 implants ions into unmasked regions 314 of the magnetically susceptible layer 304 which modifies the magnetic properties of the magnetically susceptible layer 304. The ions 308 dissociated in the processing chamber 100 are directed toward the substrate 302 and impinges on the exposed unmasked portions 314 of the magnetically susceptible layer 304 defined by the openings 310 of the mask layer 306. Exposing the unmasked portions 314 of the magnetically susceptible layer 304 to plasma energy and dissociated ions will generally begin to disrupt and change the magnetic properties when the plasma energy and the dissociated ions reach sufficient intensity to stimulate thermal motion of the atoms in the magnetically susceptible layer 304. Energy above a certain threshold caused by the dissociated ions implanted into the magnetically susceptible layer 304 will randomize the spin direction of the atoms, reducing or eliminating the magnetic properties of the material. Magnetic susceptibility is the ease with which a material will acquire magnetism when exposed to a magnetic field. Modification of the unmasked portions 314 of the magnetically susceptible layer 304 creates a pattern of domains defined by the unmodified second portions 312 (the portion of the magnetically susceptible layer 304 protected by the mask layer 306) and the modified first portions 314 (the portion of the magnetically susceptible layer 304 unprotected by the mask layer 306). The pattern may be recognized as unmodified domains (i.e., the unmodified masked second portion 312) of magnetic material and modified domains (i.e., the modified unmasked first portion 314) of the non-magnetic material, or unmodified domains (second portion 312) of high magnetic field and modified domains (first portion 314) of low magnetic field, or unmodified domains (second portion 312) of high magnetic susceptibility and modified domains (first portion 314) of low magnetic susceptibility. Accordingly, by choosing a proper range of plasma energy to implant suitable ion species with a desired amount into the magnetically susceptible layer 304, the magnetic properties of the magnetically susceptible layer 304 can be efficiently reduced, eliminated and changed to form desired magnetic and non-magnetic domains (first and second portions 314, 312) in the magnetically susceptible layer 304.

The dopants/ions impinging into the magnetically susceptible layer 304 may be utilized to change the magnetic properties of the magnetically susceptible layer 304. For example, implanted ions, such as boron, phosphorus, and arsenic ions, will not only randomize magnetic moments near the implant sites, but also impart their own magnetic properties to the surface, resulting in a change in magnetic properties, such as demagnetizing of the magnetically susceptible layer, for the implanted region (i.e., the second portion 312). In one embodiment, the magnetism or the magnetic susceptibility of the magnetically susceptible layer 304 may be modified or chanced by exposure and bombardment to a gas mixture comprising at least a dopant element selected from a group consisting of boron, phosphine, arsine, or lower oligomers thereof. In one embodiment, suitable gas mixture that may be used to provide dopants into the substrate include at least one of $BF_3$, $BH_3$, $B_2H_6$, $P_2H_5$, $PH_3$, $CF_4$, $CH_4$, $SiF_4$, $SiH_4$ and the like. In one embodiment, the ions dissociated from the gas mixture may be implanted into the magnetically susceptible layer 304 at least about 50% of the overall thickness of the magnetically susceptible layer 304. In one embodiment, the ions are implanted into between about 1 nm and about 80 nm from the substrate surface. In one embodiment, the gas mixture supplied during processing may further include an inert gas. Suitable examples of the inert gas include $N_2$, Ar, He Xe, Kr and the like. The inert gas may promote the ion bombardment in the gas mixture, thereby increasing the probability of process gas collision, thereby resulting in reduced recombination of ion species. In one embodiment, the gas mixture may be supplied into the processing chamber at a flow rate between about 5 sccm and about 300 sccm. The chamber pressure is generally maintained between about 4 mTorr and about 100 mTorr, such as about 10 mTorr.

A RF power, such as capacitive or inductive RF power, DC power, electromagnetic energy, or magnetron sputtering, may be supplied into the processing chamber 100 to assist dissociating gas mixture during processing. Ions generated by the dissociative energy may be accelerated toward the substrate using an electric field produced by applying a DC or RF electrical bias to the substrate support or to a gas inlet above the substrate support, or both. In some embodiments, the ions may be subjected to a mass selection or mass filtration process, which may comprise passing the ions through a magnetic or electric field aligned orthogonal to the desired direction of motion. The magnetic or electric field provided by the RF power may be capacitively or inductively coupled for purposes of ionizing the atoms, and may be a DC discharge field or an alternating field, such as an RF field. Alternately, microwave energy may be applied to a precursor gas containing any of these elements to generate ions. In one embodiment, ion energy less than 5 keV is utilized for magnetic medium implant, such as between about 0.2 keV and about 4.8 keV, for example about 3.5 keV. In some embodiments, the gas containing energetic ions may be a plasma. An electrical bias of between about 50 V and about 500 V is applied to the substrate support, the gas distributor, or both, to accelerate the ions toward the substrate support with the desired energy. In some embodiments, the electrical bias is also used to ionize the process gas. In other embodiments, a second electric field is used to ionize the process gas. In one embodiment, a high-frequency RF field and a low-frequency RF field are provided to ionize the process gas and bias the substrate support. The high-frequency field is provided at a frequency of 13.56 MHz and a power level between about 200 W and about 5,000 W, and the low-frequency field is provided at a frequency between about 1,000 Hz and about 10 kHz at a power level between about 50 W and about 200 W. Energetic ions may be generated by an inductively coupled electric field by providing a recirculation pathway through an inductive coil powered by RF power between about 50 W and about 500 W. The ions thus produced will generally be accelerated toward the substrate by biasing the substrate or a gas distributor as described above.

In some embodiments, generation of ions may be pulsed. Power may be applied to the plasma source for a desired time, and then discontinued for a desired time. Power cycling may be repeated for a desired number of cycles at a desired frequency and duty cycle. In many embodiments, the plasma may be pulsed at a frequency between about 0.1 Hz and about 1,000 Hz, such as between about 10 Hz and about 500 Hz. In other embodiments, the plasma pulsing may proceed with a duty cycle (ratio of powered time to unpowered time per cycle) between about 10% and about 90%, such as between about 30% and about 70%. During the first portion of the ion implantation process, the substrate temperature is maintained below a predetermined temperature, for example, below 150 degrees Celsius.

At step 206, while performing the plasma ion implantation process described at step 204, the temperature of the substrate is cooled below a predefined temperature. As discussed above, during the ion implantation process, the thermal energy or other types of energy provided during the ion impinging or plasma bombardment process may transfer kinetic energy of the energetic ions to the magnetic surface, thereby inducing differential randomization of magnetic moments with each collision, which change the magnetic properties and demagnetizing of the magnetically susceptible layer 304. However, excess thermal energy provided and/or generated during the plasma ion implantation process may transfer excess kinetic energy to the magnetic surface of the substrate, thereby adversely affecting and destroying the desired magnetic performance performed on the substrate. Accordingly, the substrate temperature needs to be efficiently controlled during the process so as to prevent undesired modification of the magnetic performance of the substrate or over hardening of the mask layer 306 disposed on the substrate 302.

In one embodiment, the temperature of the substrate is controlled by turning off the RF bias power used during the plasma ion implantation process. As the RF power is turned off, the ion bombardment and plasma dissociation occurred during processing in the processing chamber 100 is substantially reduced, thereby stopping thermal energy provided to the substrate. Accordingly, the temperature of the substrate is gradually cooled down. The cooling of the substrate may have an endpoint based on duration of time or measured substrate temperature. The cycle of cooling and additional ion implantation may be repeated until a desired concentration of implanted ions is achieved, for example, a concentration sufficient to demagnetize the unmasked portions 312 of the magnetically susceptible layer 306.

After the substrate temperature has been sufficiently cooled, the RF power is then resumed to begin a second portion of the plasma ion implantation process to implant ions into the substrate at step 208. The second portion of the ion implantation process is performed below a temperature of 150 degrees Celsius. If the substrate temperature rises or is expected to rise above 150 degrees Celsius during step 208 prior to implanting the desired amount of ions, the cooling step 206 and the second portion of the ion implantation process step 208 may be repeated performed, as shown by arrow 210, as many times as desired in order to achieve the desired levels of ion concentration.

Figure 4:
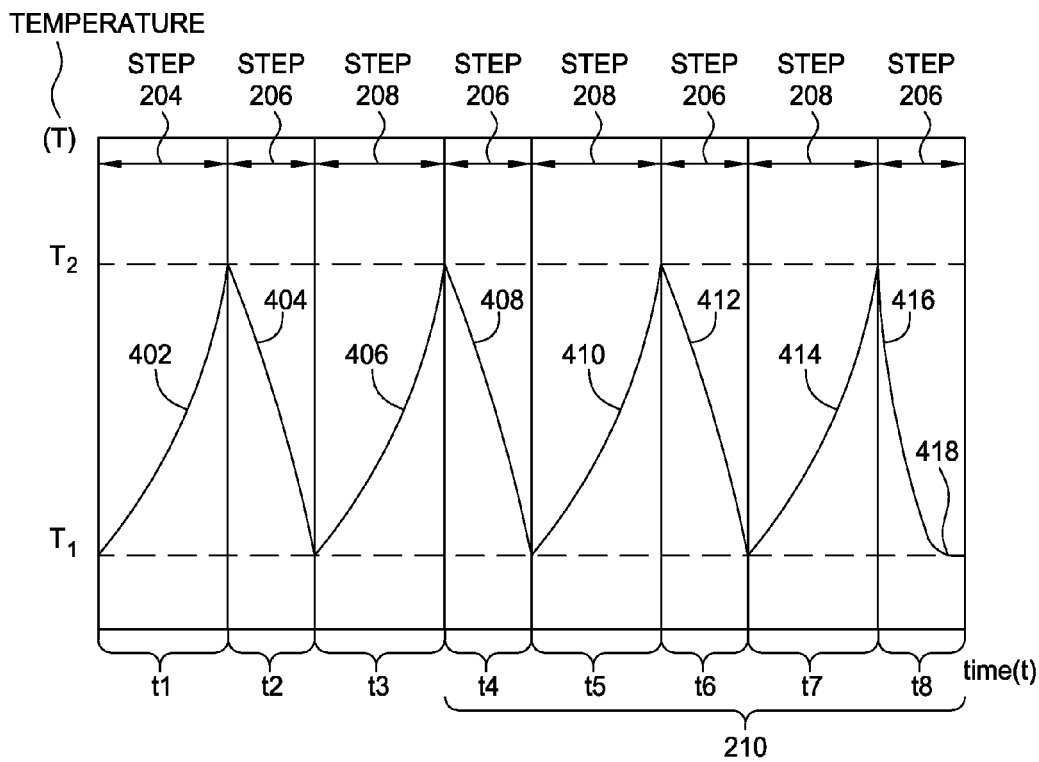
FIG. 4 depicts a temperature variation of a substrate disposed in the plasma reactor of FIG. 1 during the plasma ion implantation process of FIG. 2 of a substrate at various stages of the method of FIG. 2.

FIG. 4 depicts a temperature variation of a substrate disposed in the plasma reactor of FIG. 1 during the plasma ion implantation process. During a first time period $t_1$ in which the first portion of the plasma ion implantation process is performed as described at step 204, the substrate temperature gradually increases due to the ion bombardment and plasma dissociated ions impinging the substrate. The substrate temperature is raised from a first temperature $T_1$ to a second temperature $T_2$, as shown by the trace line 402. After the substrate has reached to the second temperature $T_2$, the cooling step is performed to keep the substrate temperature below a desired temperature, for example, 150 degrees Celsius, to preserve the magnetic performance of the substrate and film property of the mask layer 306. In one embodiment, the cooling step includes turning off the RF bias power supplied to the processing chamber to cool down the substrate temperature, as described at step 206. As the RF power is temporarily turned off and the thermal energy directed to the substrate surface by the plasma ion implantation process is temporarily ceased, the substrate is cooled from the second temperature $T_2$ down to the first temperature $T_1$, as shown by trace line 404. In order to expedite the substrate cool down process, a cooling gas mixture may be optionally supplied to the processing chamber to assist carrying away the thermal energy and heat accumulated on the substrate surface and in the processing chamber. In one embodiment, when supplying the cooling gas into the processing chamber, the chamber pressure is controlled at between about 100 mT and about 5 T. The cooling gas flow rate may be controlled at between about 100 sccm and about 5000 sccm to maintain the chamber pressure at the desired range. In another embodiment, the cooling gas may be supplied from the backside of the substrate as needed. Alternatively, the substrate may be transferred to a cooling processing chamber to perform a cooling process to cool down the substrate down to the second desired temperature $T_2$. The cooling gas used in the plasma ion processing chamber or the cooling processing chamber is selected from a gas that can serve as a cooling medium that can rapidly remove the accumulated heat on the substrate surface so as to efficiently cool down the substrate temperature within a desired short time period. After the substrate has been cooled down for a second period $t_2$ and the substrate temperature has returned to a desired substrate temperature $T_1$, the plasma ion implantation process, as described at step 206, may be resumed and the RF power used for dissociating and bombarding the gas mixture is then turned on to continue dissociate and implant ions into the substrate, as shown by the trace line 406. Similarly, after the substrate temperature has risen to the second temperature $T_2$ during the third time period $t_3$, the RF power supplied to the processing chamber is temporarily turned off to adjust the substrate temperature, as described at step 206, to allow the substrate to be gradually cooled down from the second temperature $T_2$ down to the first temperature $T_1$, as shown by trace line 408. The substrate temperature gradually cools to the first temperature $T_1$ during a fourth time period $t_4$, as shown in trace line 408. It is noted that the substrate temperature may be cooling from a subsequent portion of the implantation process as many times as needed, as shown by the loop 210 shown in FIG. 2, and trace line 410, 412, 414, 416 for a fifth, sixth, seventh and eighth periods of times $t_5$-$t_8$ shown in FIG. 4, until a desired amount of ions have been implanted into the substrate and the dopant concentration formed in the substrate has reached to a desired level. In one embodiment, ions are desired to be implanted into the substrate at a concentration between about $1 \times 10^{18}$ atoms/cm$^3$ and about $1 \times 10^{23}$ atoms/cm$^3$.

In one embodiment, the cooling gas mixture supplied during step 206 for time periods $t_2$, $t_4$, $t_6$, $t_8$ to cool down the substrate temperature is selected from a group consisting of He, Ar, $H_2$, $N_2$, $N_2O$, and the like. In one particular embodiment depicted therein, the cooling gas mixture used during step 206 is helium (He) gas.

In one embodiment, the first temperature $T_1$ of the substrate is configured to be maintained at between about 15 degrees Celsius and about 30 degrees Celsius, such as about 20 degrees Celsius. The second temperature $T_2$ of the substrate is configured to be maintained less than 150 degrees Celsius, such as at between about 50 degrees Celsius and about 130 degrees Celsius, such as about 90 degrees Celsius. The time periods, $t_1$, $t_3$, $t_5$, $t_7$ for performing the plasma ion implantation process, as described at step 204, are controlled between about 5 seconds and about 40 seconds, such as about 12 seconds. The time periods, $t_2$, $t_4$, $t_6$, $t_8$ for adjusting the substrate temperature by a substrate cool down process, as described at step 206, are controlled between about 3 seconds and about 40 seconds, such as about 15 seconds.

Figure 5:
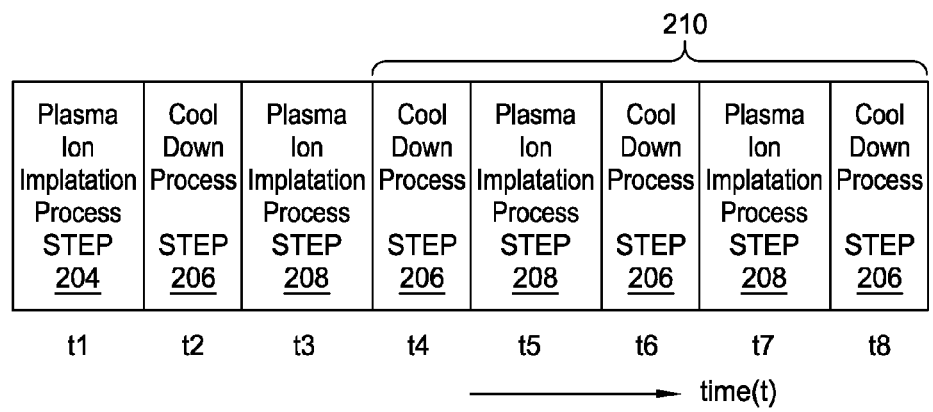
FIG. 5 depicts a box flow chart illustrating the temperature of substrate depicted in FIG. 4.

FIG. 5 depicted a process sequence table performed during a plasma ion implantation process, such as the plasma ion implantation method 200 depicted in FIG. 2. Similar to the process sequence described with referenced to FIG. 4, after the first portion of the plasma ion implantation process as described in step 204 has been performed for a first time period $t_1$, a cooling step as described in step 206 may be consecutively performed to cool down the substrate temperature for a second time period $t_2$. Alternatively, after the plasma ion implantation process is performed in a plasma ion implantation processing chamber, the substrate may be transferred to a cooling chamber or queuing station to perform a cooling down process or to passively cool the substrate for the second time period $t_2$. After the substrate temperature has been cooled to a desired temperature range, another plasma ion implantation process as described in step 208 may be performed for a third time period $t_3$, to continue implanting ions into the substrate. While implanting, the substrate temperature may rise. Therefore, a cooling step as described in step 206 may be consecutively performed to cool down the substrate temperature for a four time period $t_4$. As described above, the second portion of the plasma ion implantation process as described at step 206 and the cooling process as described at step 206 may be repeated performed for multiple times, such as for fifth, sixth, seventh, and eighth time periods ($t_5$-$t_8$) as shown in exemplary embodiment depicted FIG. 5, as needed until a desired amount of ions or dopants has been implanted into the substrate without adversely overheating the substrate during the plasma ion implantation process.

Figure 6:
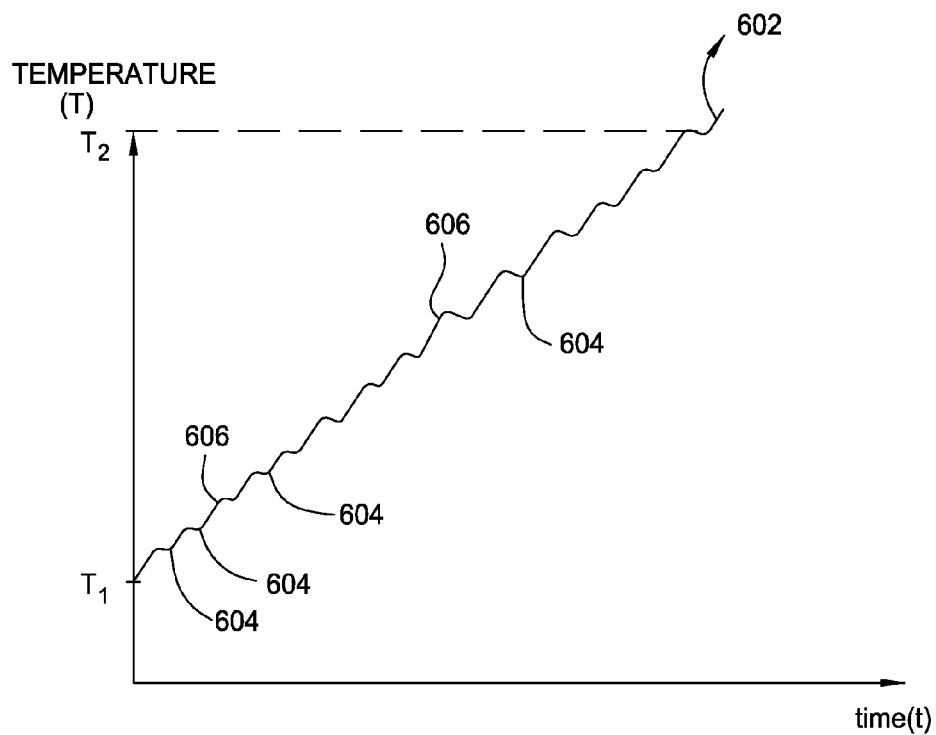
FIG. 6 depicts a temperature variation of a substrate disposed in the plasma reactor of FIG. 1 according to another embodiment of the invention.

FIG. 6 depicts another embodiment of controlling the substrate temperature while implanting ions/dopants into the substrate. As described above, while plasma implanting ions into the substrate, the substrate temperature may be increased due to the thermal energy generated from the plasma bombardment during the ion implanting process. Accordingly, a pulsed bias RF power may be used to efficiently control the substrate temperature from overheating during the ion implantation process. As the RF power is performed in pulsed mode, the RF power is temporarily ceased and paused in pulsed mode for a short period of time. As the RF power is temporarily ceased, the thermal energy generated during the ion implantation process is stopped as well, allowing the substrate temperature to have a short period of time to drop down. As shown in a substrate temperature trace line 602 depicted in FIG. 6, as the RF power applied during the ion implantation process is in pulsed mode, the substrate temperature may be dropped, as shown by the downturn point 604, as the RF power is temporality pulsed. As the RF power is resumed to pulse, the substrate is heated again by the thermal energy generated from the RF power and the substrate temperature is increased by the thermal energy generated during the plasma ion implantation process, as shown by the uptrend line 606 depicted in the substrate temperature trace line 602. In this configuration, as the RF power supplied in pulsed mode does not wait until the substrate temperature is cooled down back to the original unprocessed temperature $T_1$ to resume the plasma ion implantation process, the substrate temperature may still be incrementally increased during the process of performing the plasma ion implantation process in RF pulsed mode.

Figure 7:
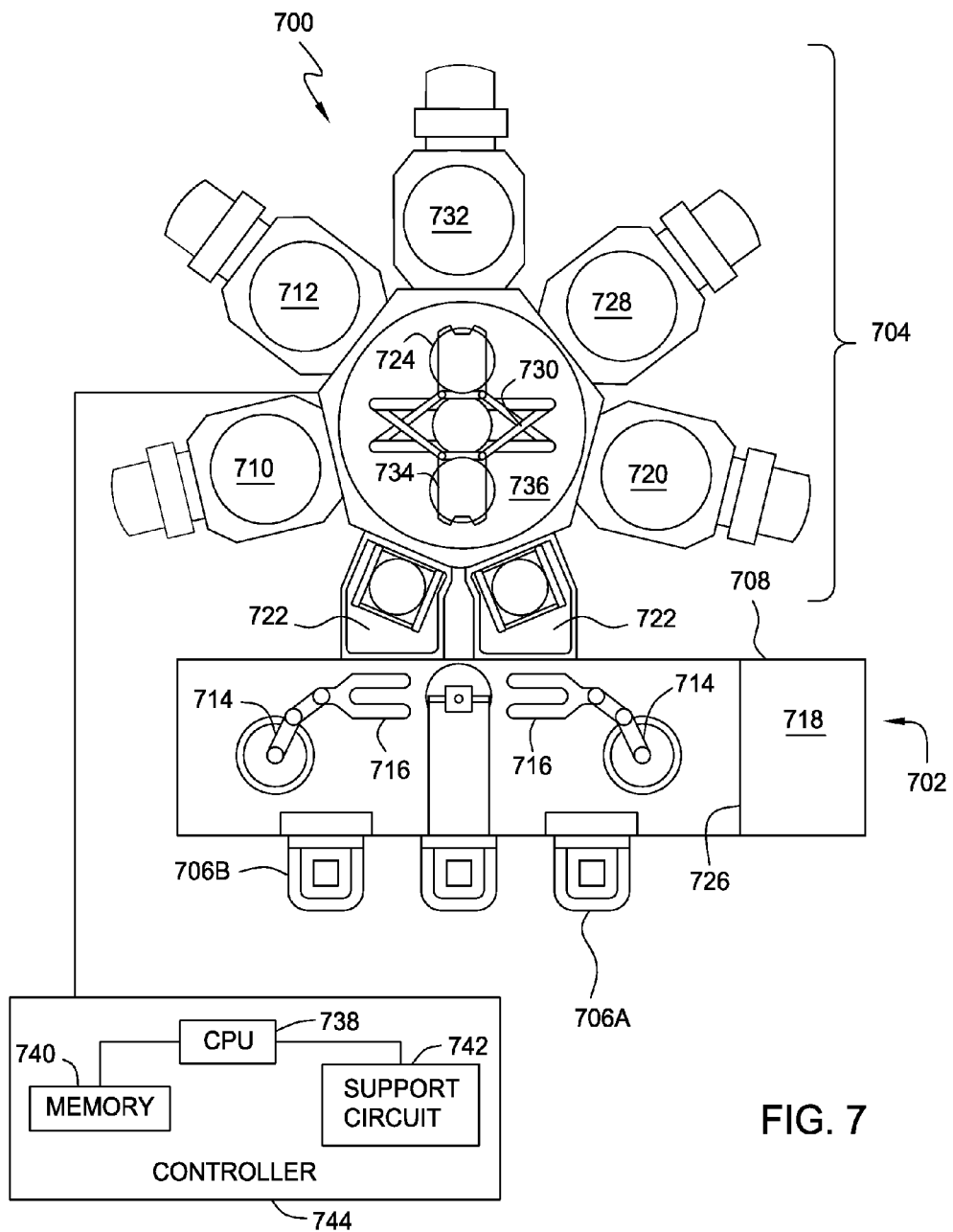
FIG. 7 depicts a system that has a plurality of processing chamber of FIG. 1 incorporated thereto according to one embodiment of the invention.

FIG. 7 is a schematic, top plan view of an exemplary processing system 700 that includes one embodiment of a processing chamber, such as the processing chamber 100 depicted in FIG. 1, suitable for practicing the present invention. In one embodiment, the processing system 700 may be a CENTURA® integrated processing system, commercially available from Applied Materials, Inc., located in Santa Clara, Calif. It is contemplated that other processing systems (including those from other manufacturers) may be adapted to benefit from the invention.

The system 700 includes a vacuum-tight processing platform 704, a factory interface 702, and a system controller 744. The platform 704 includes a plurality of processing chambers 710, 712, 732, 728, 720 and at least one load-lock chamber 722 that are coupled to a vacuum substrate transfer chamber 736. Two load lock chambers 722 are shown in FIG. 1. The factory interface 702 is coupled to the transfer chamber 736 by the load lock chambers 722.

In one embodiment, the factory interface 702 comprises at least one docking station 708 and at least one factory interface robot 714 to facilitate transfer of substrates. The docking station 708 is configured to accept one or more front opening unified pod (FOUP). Two FOUPS 706A-B are shown in the embodiment of FIG. 7. It is noted that substrate may also be transferred, arranged or positioned in a vertical configuration in the factory interface 702 to be transferred into the load lock chambers 722. The factory interface robot 714 having a blade 716 disposed on one end of the robot 714 is configured to transfer the substrate from the factory interface 702 to the processing platform 704 for processing through the load lock chambers 722. Optionally, one or more metrology stations 718 may be connected to a terminal 726 of the factory interface 702 to facilitate measurement of the substrate from the FOUPS 706A-B.

Each of the load lock chambers 722 have a first port coupled to the factory interface 702 and a second port coupled to the transfer chamber 736. The load lock chambers 722 are coupled to a pressure control system (not shown) which pumps down and vents the load lock chambers 722 to facilitate passing the substrate between the vacuum environment of the transfer chamber 736 and the substantially ambient (e.g., atmospheric) environment of the factory interface 702.

The transfer chamber 736 has a vacuum robot 730 disposed therein. The vacuum robot 730 has a blade 734 capable of transferring substrates 302 between the load lock chambers 722 and the processing chambers 710, 712, 732, 728, 720.

In one embodiment, at least one process chambers 710, 712, 732, 728, 720 is a plasma ion implantation chamber, such as the plasma ion implantation processing chamber 100 depicted in FIG. 1. One suitable reactor in which the process may be practiced is a P3i® reactor, available from Applied Materials, Inc., of Santa Clara, Calif. It is contemplated that the methods described herein may be practiced in other suitably adapted plasma reactors, including those from other manufacturers. Other plasma ion implantation chambers, including those from other manufacturers, may be utilized.

Furthermore, in another embodiment, at least one process chamber 710, 712, 732, 728 may be configured to dedicate as a cooling processing chamber to perform the cool down process, as described at step 206 above with referenced to FIG. 2.

The cooling processing chamber may supply the cooling gas to the substrate surface to cool down the temperature of the substrate as needed.

The system controller 744 is coupled to the processing system 700. The system controller 744 controls the operation of the system 700 using a direct control of the process chambers 710, 712, 732, 728, 720 of the system 700 or alternatively, by controlling the computers (or controllers) associated with the process chambers 710, 712, 732, 728, 720 and the system 700. In operation, the system controller 744 enables data collection and feedback from the respective chambers and system controller 744 to optimize performance of the system 700.

The system controller 744 generally includes a central processing unit (CPU) 738, a memory 740, and support circuit 742. The CPU 738 may be one of any form of a general purpose computer processor that can be used in an industrial setting. The support circuits 742 are conventionally coupled to the CPU 138 and may comprise cache, clock circuits, input/output subsystems, power supplies, and the like. The software routines, such as a method 200 with reference to FIG. 2, when executed by the CPU 738, transform the CPU 738 into a specific purpose computer (controller) 744. The software routines may also be stored and/or executed by a second controller (not shown) that is located remotely from the system 700.

In one embodiment, a processing system such as the processing system 700 may have four processing chambers, including at least one plasma ion implantation chamber and/or an optional cooling chamber, coupled thereto, with a single substrate handling robot configured to manipulate individual substrates disposed on substrate carriers, or the carriers themselves, and to flip the substrates or carriers. In one embodiment, the four processing chambers may be a wet clean chamber, a sputtering chamber, a physical imprint chamber, a plasma ion implant chamber, a resist stripping chamber, and a CVD chamber, which may be plasma-enhanced. In such an embodiment, a substrate carrier having a plurality of substrate disposed thereon may be processed in each chamber consecutively to produce hard drive substrates as described herein. In some embodiments, the substrates may be disposed in the chambers using substrate supports that expose a surface of each substrate to the processing environment simultaneously.

Accordingly, processes and apparatus of reducing thermal energy impact on a substrate during a plasma ion implantation process used to form magnetic and non-magnetic domains on a magnetically susceptible surface are provided. The process advantageously provides a method to controlling a substrate temperature below a predefined level while implanting ions into a substrate surface while maintaining desired level and thickness. The substrate temperature maintained during the plasma ion implantation process preserves magnetic properties and topography of the substrate in a patterned manner to enable the creation of densely packed magnetic and non-magnetic domains on the substrate.

While the foregoing is directed to embodiments of the invention, other and further embodiments of the invention may be devised without departing from the basic scope thereof.

What is claimed is:

1. A method of controlling a substrate temperature during a plasma ion implantation process comprising:
    (a) supplying an implantation energy to perform a first portion of a plasma ion implantation process on a substrate having a magnetically susceptible layer formed thereon in a processing chamber for a first time period, wherein a temperature of the substrate is maintained below about 150 degrees Celsius;
    (b) cooling the temperature of the substrate after the first portion of the plasma ion implantation process has been completed by turning off bias power while maintaining the implantation energy on; and
    (c) performing a second portion of the plasma ion implantation process on the substrate, wherein the temperature of the substrate is maintained below 150 degrees Celsius.

2. The method of claim 1, further comprising:
repeating step (b)-(c) in-situ a processing chamber.

3. The method of claim 1, further comprising:
repeating (b)-(c) until a dopant concentration of the substrate has reached between about $1 \times 10^{18}$ atoms/cm$^3$ and about $1 \times 10^{23}$ atoms/cm$^3$.

4. The method of claim 1, wherein the first portion of the plasma ion implantation process has a duration of between about 5 seconds and about 40 seconds.

5. The method of claim 1, wherein performing the plasma ion implantation process on the substrate further comprises:
    implanting ions into a portion of the magnetically susceptible layer exposed by a patterned mask layer disposed on the substrate.

6. The method of claim 5, wherein the ions implanted into the magnetically susceptible layer are selected from a group consisting of boron, phorosphine, and arsine.

7. The method of claim 1, wherein the magnetically susceptible layer includes a first layer disposed on a second layer.

8. The method of claim 7, wherein the first layer is selected from a group consisting of iron, nickel, platinum, and combinations thereof; and the second layer is selected from a group consisting of cobalt, chromium, platinum, tantalum, iron, terbium, gadolinium, and combinations thereof.

9. The method of claim 1, wherein the implantation energy is supplied to a gas mixture in the processing chamber to ionize at least a portion of the gas mixture.

10. The method of claim 9, wherein the RF energy is supplied in a pulsed mode.

11. The method of claim 1, wherein the cooling process further comprises:
    supplying a cooling gas to the surface of the substrate.

12. The method of claim 11, wherein the cooling gas includes at least one of He, Ar, $H_2$, $N_2$ or $N_2O$.

13. A method of controlling a substrate temperature during a plasma ion implantation process comprising:
    (a) supplying an implantation energy to perform a first portion of a plasma ion implantation process on a substrate having a magnetically susceptible layer formed thereon in a processing chamber for a first time period, wherein a temperature of the substrate is maintained below about 150 degrees Celsius;
    (b) turning off bias power while maintaining the implantation energy on during the first portion of the plasma ion implantation process to cool down the temperature between about 15 degrees Celsius and about 30 degrees Celsius; and
    (c) continuing performing a second portion of the plasma ion implantation process on the substrate, wherein the temperature of the substrate is maintained below 150 degrees Celsius.

14. The method of claim 13, further comprising:
repeating step (b)-(c) in-situ a processing chamber.

15. The method of claim 13, further comprising:
repeating (b)-(c) until a dopant concentration of the substrate has reached between about $1 \times 10^{18}$ atoms/cm$^3$ and about $1 \times 10^{23}$ atoms/cm$^3$.

16. The method of claim 13, wherein turning off the bias power further comprises:

supplying a cooling gas to the substrate surface.

17. The method of claim 16, wherein the cooling gas includes at least one of He, Ar, $H_2$, $N_2$ or $N_2O$.

* * * * *